US008322917B2

(12) United States Patent
Gatti et al.

(10) Patent No.: US 8,322,917 B2
(45) Date of Patent: Dec. 4, 2012

(54) METHOD FOR TESTING A HEAT PIPE AND CORRESPONDING TEST DEVICE

(75) Inventors: Marc Gatti, Pessac (FR); Gerard Nemoz, Maisons-Alfort (FR); Bruno Bellin, Verrieres le Buisson (FR); Christian Pitot, Boulogne-Billancourt (FR)

(73) Assignee: Thales, Neuilly sur Seine (FR)

( * ) Notice: Subject to any disclaimer, the term of this patent is extended or adjusted under 35 U.S.C. 154(b) by 938 days.

(21) Appl. No.: 12/334,742

(22) Filed: Dec. 15, 2008

(65) Prior Publication Data
US 2009/0161721 A1  Jun. 25, 2009

(30) Foreign Application Priority Data

Dec. 21, 2007 (FR) ........................ 07 09052

(51) Int. Cl.
*G01K 1/16* (2006.01)
*G01K 25/00* (2006.01)
(52) U.S. Cl. ............................ 374/44; 374/29
(58) Field of Classification Search ........... 374/44,
374/43, 134, 135, 1, 10, 11, 29–33, 179, 374/208
See application file for complete search history.

(56) References Cited

U.S. PATENT DOCUMENTS

| | | | | |
|---|---|---|---|---|
| 7,168,851 B2 * | 1/2007 | Kim et al. | ......................... | 374/44 |
| 7,254,027 B2 * | 8/2007 | Belady et al. | ................. | 361/704 |
| 7,374,334 B2 * | 5/2008 | Liu et al. | ......................... | 374/44 |
| 7,441,947 B2 * | 10/2008 | Liu et al. | ......................... | 374/29 |
| 7,445,378 B2 * | 11/2008 | Liu et al. | ......................... | 374/29 |
| 7,445,380 B2 * | 11/2008 | Liu et al. | ......................... | 374/44 |
| 7,445,385 B2 * | 11/2008 | Lin | ................................ | 374/147 |
| 7,517,142 B2 * | 4/2009 | Liu et al. | ......................... | 374/29 |
| 7,527,426 B2 * | 5/2009 | Liu et al. | ......................... | 374/29 |
| 7,530,734 B2 * | 5/2009 | Liu et al. | ......................... | 374/44 |
| 7,530,735 B2 * | 5/2009 | Liu et al. | ......................... | 374/44 |
| 7,530,736 B2 * | 5/2009 | Liu et al. | ......................... | 374/44 |
| 7,537,379 B2 * | 5/2009 | Liu et al. | ......................... | 374/44 |
| 7,537,380 B2 * | 5/2009 | Liu et al. | ......................... | 374/44 |
| 7,539,020 B2 * | 5/2009 | Chow et al. | ................... | 361/726 |
| 7,543,983 B2 * | 6/2009 | Wu | .............................. | 374/179 |
| 7,547,138 B2 * | 6/2009 | Liu et al. | ......................... | 374/44 |
| 7,547,139 B2 * | 6/2009 | Liu et al. | ......................... | 374/44 |
| 7,553,072 B2 * | 6/2009 | Liu et al. | ......................... | 374/44 |
| 7,553,073 B2 * | 6/2009 | Liu et al. | ......................... | 374/44 |
| 7,553,074 B2 * | 6/2009 | Liu et al. | ......................... | 374/44 |
| 7,581,878 B2 * | 9/2009 | Lee et al. | ......................... | 374/44 |
| 7,594,749 B2 * | 9/2009 | Liu et al. | ......................... | 374/44 |
| 7,611,276 B2 * | 11/2009 | Liu et al. | ......................... | 374/44 |
| 7,632,009 B2 * | 12/2009 | Liu et al. | ......................... | 374/44 |
| 7,632,010 B2 * | 12/2009 | Liu et al. | ......................... | 374/44 |
| 7,637,655 B2 * | 12/2009 | Liu et al. | ......................... | 374/44 |
| 7,648,267 B2 * | 1/2010 | Liu et al. | ......................... | 374/44 |
| 7,674,037 B2 * | 3/2010 | Liu et al. | ......................... | 374/44 |
| 7,686,504 B2 * | 3/2010 | Liu et al. | ......................... | 374/44 |
| 7,922,387 B2 * | 4/2011 | Liu | ................................ | 374/147 |
| 2006/0096740 A1 | 5/2006 | Zheng | | |

(Continued)

*Primary Examiner* — Yaritza Guadalupe-McCall
(74) *Attorney, Agent, or Firm* — Stroock & Stroock & Lavan LLP

(57) ABSTRACT

The operational reliability of a heat pipe 200 provided for carrying heat dissipated by an electronic component 101 to a heat exchanger 300 is tested by using the heat pipe in the reverse direction, by providing energy in the form of heat at the exchanger 300, and by measuring the propagation time $\Delta P$ of the heat from the exchanger to the electronic component. Application to heat pipe tests in onboard computers.

17 Claims, 3 Drawing Sheets

U.S. PATENT DOCUMENTS

| | | | |
|---|---|---|---|
| 2006/0256834 A1* | 11/2006 | Chang et al. | 374/5 |
| 2007/0116088 A1* | 5/2007 | Liu et al. | 374/147 |
| 2007/0121700 A1* | 5/2007 | Liu et al. | 374/141 |
| 2007/0127547 A1* | 6/2007 | Liu et al. | 374/147 |
| 2007/0127548 A1* | 6/2007 | Liu et al. | 374/147 |
| 2007/0127549 A1* | 6/2007 | Liu et al. | 374/147 |
| 2007/0127550 A1* | 6/2007 | Liu et al. | 374/147 |
| 2007/0131040 A1* | 6/2007 | Liu et al. | 73/865.8 |
| 2007/0133655 A1* | 6/2007 | Liu et al. | 374/147 |
| 2007/0133656 A1* | 6/2007 | Liu et al. | 374/147 |
| 2007/0140313 A1* | 6/2007 | Liu et al. | 374/147 |
| 2007/0147465 A1* | 6/2007 | Liu et al. | 374/5 |
| 2007/0147470 A1* | 6/2007 | Liu et al. | 374/147 |
| 2007/0153872 A1* | 7/2007 | Wu | 374/148 |
| 2007/0160109 A1* | 7/2007 | Liu et al. | 374/147 |
| 2007/0160110 A1* | 7/2007 | Liu et al. | 374/147 |
| 2007/0160111 A1* | 7/2007 | Liu et al. | 374/147 |
| 2007/0165692 A1* | 7/2007 | Liu et al. | 374/147 |
| 2007/0195854 A1* | 8/2007 | Liu et al. | 374/43 |
| 2007/0237202 A1* | 10/2007 | Li | 374/147 |
| 2007/0286256 A1* | 12/2007 | Liu et al. | 374/147 |
| 2007/0286257 A1* | 12/2007 | Liu et al. | 374/147 |
| 2007/0286258 A1* | 12/2007 | Liu et al. | 374/147 |
| 2009/0116538 A1* | 5/2009 | Liu | 374/147 |
| 2009/0161721 A1* | 6/2009 | Gatti et al. | 374/44 |
| 2009/0161723 A1* | 6/2009 | Liu | 374/147 |
| 2009/0190627 A1* | 7/2009 | Liu | 374/147 |
| 2009/0196325 A1* | 8/2009 | Liu | 374/147 |
| 2009/0296772 A1* | 12/2009 | Choi et al. | 374/43 |
| 2011/0122915 A1* | 5/2011 | Wang et al. | 374/44 |

* cited by examiner

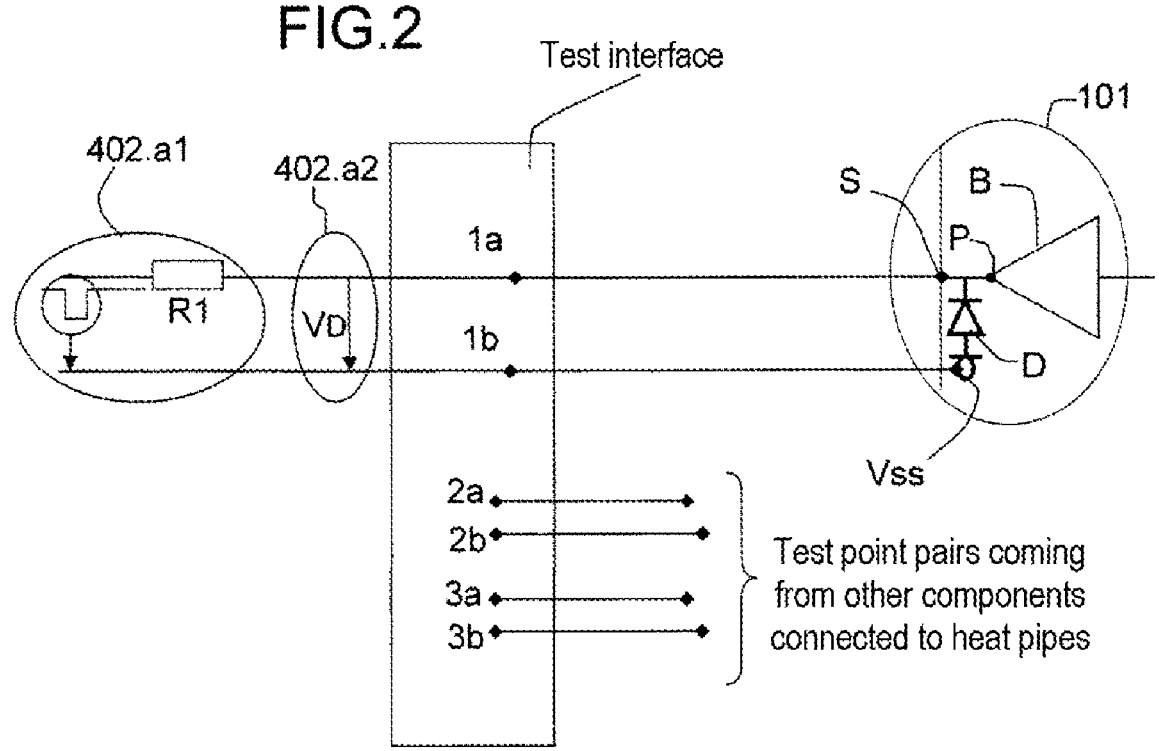
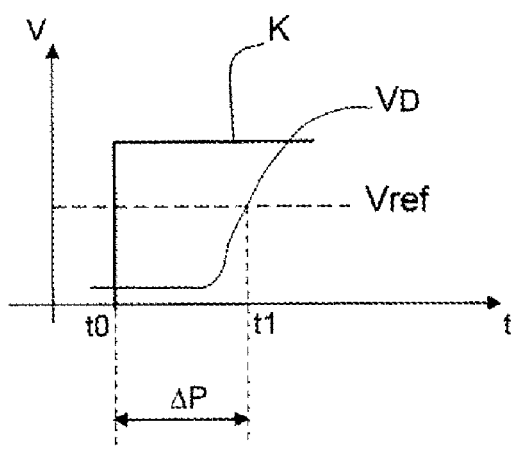

METHOD FOR TESTING A HEAT PIPE AND CORRESPONDING TEST DEVICE

This application claims the benefit of French Application No. 07 09052, filed Dec. 21, 2007, the entire disclosure of which is incorporated by reference in its entirety.

DOMAIN OF THE INVENTION

The present invention relates to a method for testing a heat pipe or heat pipes of an electronic module and a corresponding test device.

It applies notably to electronic modules such as onboard computers, for example onboard aircraft. These computers specifically incorporate electronic circuit boards which comprise components, some of which have a high heat dissipation. The increase in the processing power of these computers and the increased integration of the electronics have the effect of considerably increasing the power to be dissipated per unit of volume available in the computer. For example, according to the prior art in the matter of integration, four two-sided electronic circuit boards mounted in the closed volume of the computer provide a developed accommodation surface area for the electronic components of the order of 2800 cm$^2$ and a power to be dissipated of approximately 45 watts, that is a power per unit area of 16 milliwatts per cm$^2$.

The reduction in the dimensions of the components and their compact assembly therefore accentuate the problem of heat dissipation. It is notably essential to prevent any concentration of heat which is harmful to the electronic components both in their performance and their reliability.

TECHNICAL BACKGROUND

For these reasons, in addition to forced air circulation produced by an integrated ventilation system, by which ambient or cooled air can travel across free spaces between the boards, heat-exchange means have been provided specifically for each of the highly dissipating components, and notably heat pipes, which make it possible to carry the heat given off by a component, out of the module (computer) to a heat exchanger, such as for example an external radiator or an external cold plate.

A heat pipe is a passive device for carrying heat, based on the liquid-vapour change of state of a fluid. It is a sealed enclosure, such as an aluminium or copper tube, which contains a liquid in balance with its vapour phase. Typically, one end is in thermal contact with the component which gives off the heat, for example a processor: this is the hot object. The other end is in thermal contact with the heat exchanger: the cold object. Under the effect of the operation of the processor, the walls of the tube heat up and vaporize the liquid. The pressure of the vapour increases and causes the vapour to migrate to the cold object. Under the cold object, the relative cooling of the walls causes the vapour to condense, increasing the volume of the liquid which migrates and flows back to the hot object.

Each end of a heat pipe is therefore furnished with a shoe providing a placement surface which will allow a good thermal contact with the hot and cold objects.

In practice, the heat pipe is thermally efficient at cooling a dissipative component provided that it is mounted suitably on this component, in good thermal contact with it, that is to say putting up a weak thermal resistance to the passage of the calories, typically a thermal resistance of less than one degree per watt.

If it is defectively mounted, the cooling will not only be ineffective but it may also cause a deterioration of the operation of the component and even its destruction, by thermal stress, when the computer is powered up by not effectively countering the thermal drift of the active portions of the component. This defective mounting may in practice occur in the manufacture of the computer, or during the repair of the computer.

When a visual inspection of the mounting between the heat pipe and the component is possible, it does not usually make it possible to guarantee the quality of the thermal contact, which may be adversely affected by the state of the surfaces in contact being polluted by dust or fluids.

SUMMARY OF THE INVENTION

An object of the invention is to solve this technical problem.

The technical solution provided by the invention is a non-destructive test method by which the user measures the effectiveness of a heat pipe in carrying heat from the heat exchanger to the component.

More particularly, embodiments of the invention relate to a method for testing a heat pipe between an electronic component and a heat exchanger. The method consists in inverting the direction of heat circulation in the said heat pipe, while bringing heat to the heat exchanger, and in measuring the time for propagating the heat in the heat pipe up to the component.

Embodiments of the invention also relate to a corresponding test device, and an electronic module suitable for such a test method.

Still other objects and advantages of embodiments of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention.

Accordingly, the drawings and description thereof are to be regarded as illustrative in nature, and not as restrictive.

BRIEF DESCRIPTION OF THE DRAWINGS

FIG. 2 illustrates means for detecting heat using a protection diode of an output pin of an electronic component according to an embodiment of the invention;

FIG. 3 is a curve of the voltage variation over time at the terminals of the diode, with the heating of the component according to embodiments of the invention.

DETAILED DESCRIPTION

Figure 1:
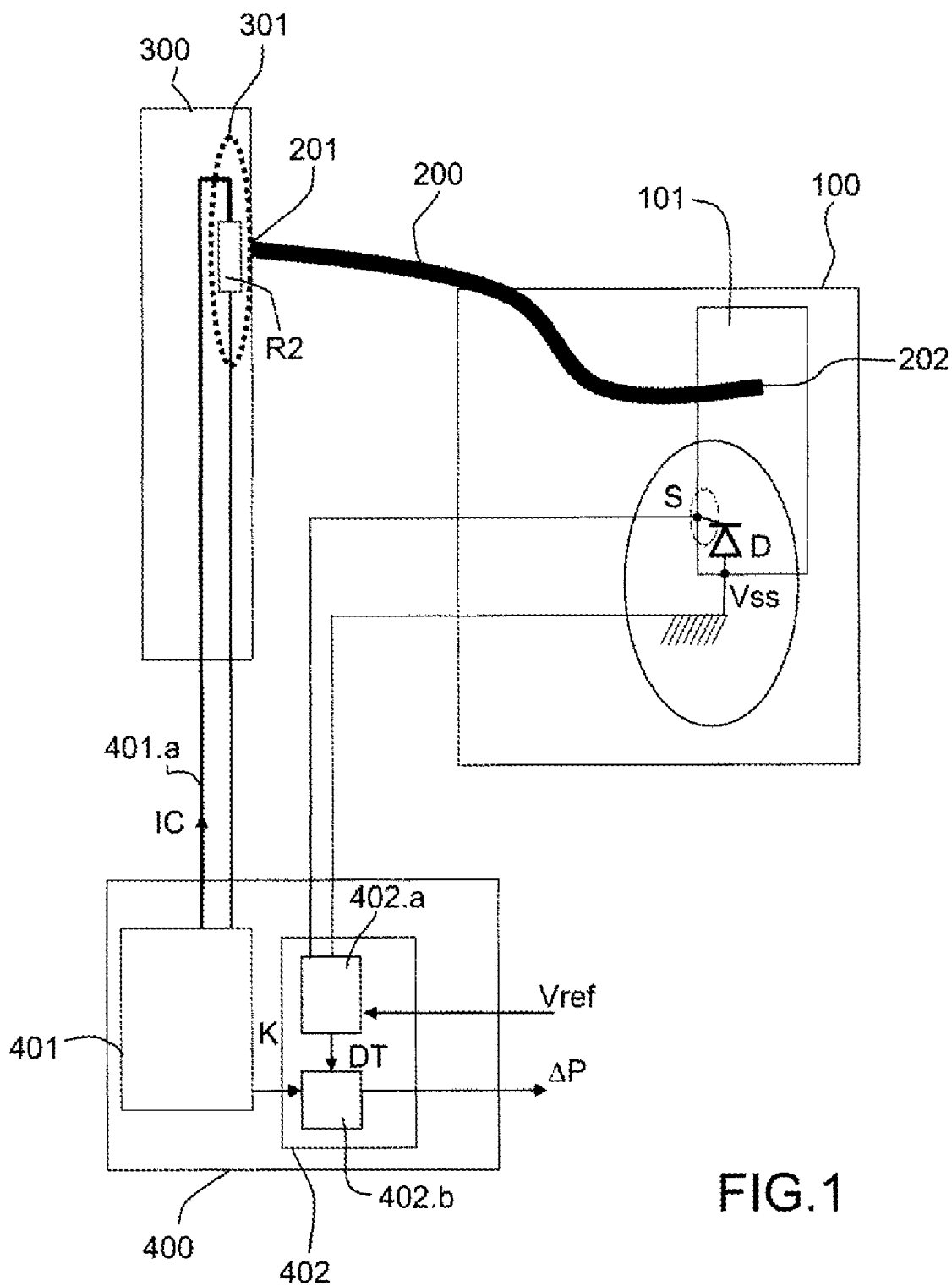
FIG. 1 illustrates a computer comprising a heat pipe connecting a component to a heat exchanger outside the computer and a test device according to an embodiment of the invention.

FIG. 1 illustrates a board 100 of a computer or electronic module, of which a component 101 is in thermal contact with one end 202 of a heat pipe 200. The other end 201 of the heat pipe 200 is in thermal contact with a heat exchanger 300.

In practice, several boards such as the board 100 are placed inside an electronic module or computer, with one or more heat pipes, making it possible to carry the heat emitted by one or more components of these boards. The heat exchanger 300 is on the outside of this electronic module, passages being arranged in a wall of the computer to allow the heat pipe(s) to pass through.

The test is advantageously carried out once the computer is fully assembled, with all its boards and all its heat pipes, and prior to its first power-up.

In operation, the heat exchanger 300 is the cold portion of the heat pipe 200 and the component 101 is the hot portion: the heat pipe carries the calories dissipated by the component to the heat exchanger.

According to embodiments of the invention, during the test procedure, the heat pipe is used in the reverse direction, bringing energy in the form of heat to the exchanger, in order to verify that the heat is carried to the component 101, and to measure how long it takes.

A device 400 for testing the heat pipe 200 therefore comprises:
- means 401 for heating the heat exchanger 300, or at least a portion 301 of the exchanger covering the zone of thermal contact with the heat pipe,
- means 402 for detecting heat (that is to say an increase in temperature) on the component 101, in order to measure the elapsed time between the provision of heat on the exchanger and the detection of heat on the component.

In one embodiment of such a test device as illustrated in FIG. 1, the heating means 401 comprise a current loop 401.a supplying with current IC a resistor R2 placed in good thermal contact with the heat exchanger, in the zone 301 of thermal contact with the heat pipe tested. Advantageously, the resistor is incorporated into the heat exchanger, such that the only thing left to do is to connect it into the current loop, during the test.

Such heating means are simple and not very costly to apply, and they make it possible to control precisely the power supplied, without requiring a high-precision resistor. Specifically it is known how to easily measure the precise current IC injected into the loop and the voltage at the terminals of the resistor, which makes it possible to control the supplied power precisely.

The heat detection means 402 may use a temperature sensor fitted to the component.

In a preferred embodiment illustrated in FIGS. 1 and 2, the heat detection means 402 advantageously use as a detection means a protection diode D, for protection against electrostatic discharges, that is usually provided on the connector pins of an electronic component. Notably, the electronic components of the CMOS type largely used today in computers comprise such protection diodes on both the input and output connector pins.

In a known manner, the electrical characteristics of a diode vary according to the temperature of the junction. As a reminder, the relation that links the direct current I of a diode at the voltage V to its terminals is as follows:

$$I = Is\, e^{(V/kT)} \qquad \text{Eq. 1}$$

where k is a physical characteristic of the material, Is is the saturation current characteristic of the diode, and T is the absolute temperature in ° Kelvin. Typically, for a silicon technology diode, kT=25 mV at 25° C. (or 297° Kelvin). From Eq. 1 comes: $V = kT \log(I/Is)$ and $dV/dT = k \log(I/Is)$ FIG. 3 therefore illustrates the variation of the voltage $V_D$ that can be observed at the terminals of a diode with an increase in the temperature.

Therefore, in embodiments of the invention, use is made of a protection diode of a pin of an electronic component as a temperature sensor. The detection principle is then as follows: at the time t0, the heating is activated (signal K—FIG. 1); then, the voltage variation is observed at the terminals of the diode. This makes it possible to determine the time t1 when the heat arrives at the component.

In practice, to obtain sufficient sensitivity, the diode will be made to work preferably with a direct current I such that the ratio I/Is high. It is possible to achieve very high I/Is ratios, typically of the order of 10 000, by using a pulse generator with a serial impedance R1 making it possible to control a direct current I into the diode. Care should then be taken to comply with a low cyclical ratio, in order not to induce thermal drift of the diode. For example, with a voltage pulse lasting 1 microsecond, and a voltage measurement $V_D$ at the terminals of the diode taken every $1/10^{th}$ of a second, the cyclical ratio is 1/100 000. In these conditions, even with an I/s ratio of 10 000, the average current will only be Is/10: the heating of the diode due to the measurement process is negligible. With a saturation current Is of the diode of 20 microamperes, and a direct diode current I of 0.2 ampere to measure temperature, the dissipation of power due to this measurement will be only approximately 2 microwatts. With this I/Is ratio, for a silicon diode (kT=25 mV), the sensitivity will therefore be approximately 0.8 mv/° C.: a temperature rise of 20° C. at the component will be detected as an increase in the diode voltage $V_D$ of approximately 15 millivolts.

In practice, an I/Is ratio of the order of 10 000 may be obtained by means of a pulse generator of 10 to 20 volts amplitude and a serial impedance R1 of approximately 50 ohms which corresponds to very normal values for such generators.

Preferably, use is made of a pin that is not used in operation and consequently not connected to other components. Such unused pins are frequent on complex components comprising a large number of pins, because certain pins correspond to optional functionalities.

In practice, an electrostatic discharge protection circuit of an input or output stage of an electronic component usually comprises two diodes:
- a negative overvoltage protection diode, of which the cathode is typically connected between the connection pad of the output of the electronic chip and the corresponding pin of the component and of which the anode is connected to the logic ground Vss of the component; and
- a positive overvoltage protection diode of which the anode is then connected not to the ground but to the logic supply voltage of the output stage.

Without distinction it is possible to use one or the other diode as the temperature detector according to the measurement principle of the invention. For the negative discharge protection diode, the generator used will apply a negative voltage pulse relative to the logic ground; for the positive discharge protection diode, the generator used will apply a positive voltage pulse relative to the supply voltage of the component.

There is however an advantage in using the negative discharge protection diode. Specifically, the logic ground is a voltage that is often already present on the connector of the computer, and therefore already available for carrying out a test according to embodiments of the invention. In addition, this logic ground is common to all the electronic components present in a computer. If the computer comprises a plurality of heat pipes, each associated with a different electronic component, the use of the protection diodes connected to the logic ground therefore makes it possible to minimize the test points necessary on the connector of the computer. In other words, if there are N components, only N+1 test points will be required on the connector: N test points each corresponding to a pin of a component, plus one common test point corresponding to the logic ground.

If use is made of the other protection diode, which is connected to the logic supply voltage of the component, since the level of this voltage may vary from one component to another, depending on the technology, it is necessary to provide two test points per component on the connector of the computer.

According to another aspect of the invention, use is made preferably of a protection diode associated with an output pin of an electronic component.

Specifically, when the computer is not powered up, the output stage of an electronic component may behave like a virtually infinite impedance with respect to the logic ground and the supply voltage of the component. This is notably the case for the output stages of CMOS technology electronic components. Therefore, during the test according to embodiments of the invention, only one of the protection diodes is capable of allowing the current to pass, if it is correctly polarized: if a negative voltage pulse is applied to the output pin, only the negative discharge protection diode will conduct current.

Furthermore, if use is made of a protection diode associated with an input pin of the electronic component, the sensitivity of the temperature detection may be compromised by a serial resistor or an external pull-up resistor. Specifically, in certain electronic components, a serial resistor is provided between the diode and the connector pad of the chip. In addition, the input stages are usually polarized to the logic ground or to the supply voltage by an external pull-up resistor. These resistors adversely affect the sensitivity of a temperature measurement.

According to a preferred embodiment of the invention, use is therefore made of a protection diode associated with an output pin of a component, for which such serial or pull-up resistors do not exist.

FIG. 2 details the measurement circuit associated with the protection diode D for protection against negative overvoltages of an output pin S of an electronic component 101, and a corresponding isolation and amplification or "buffer" stage B.

The diode D has its cathode typically connected between the connector pad p of the output of the component and the corresponding pin S and its anode connected to the logic ground Vss of the component.

The output S and the logic ground Vss of the component are brought to a test interface of the computer, forming input points 1a and 1b, which will make it possible to measure the voltage $V_D$ at the terminals of the diode D by the means 402 of the test device.

Usually, to check each heat pipe of a computer comprising N heat pipes, the test interface will comprise as many pairs of input points (1a, 1b), (2a, 2b), (3a, 3b) etc. as components of the computer that are connected to heat pipes, that is 2N points for N components (one component per heat pipe).

For the test of the thermal contact of N heat pipes, each with one component of the computer, if use is made, for the detection on each component, of the protection diode of a pin that is connected to the logic ground, the number of test points may be reduced to N+1: the points 1b, 2b, 2c etc. representing the logic ground may be reduced to a single point of the test interface, common to the N components.

As illustrated in FIGS. 1 and 2, the heat detection means 402 comprise:

means 402.a1 for applying to the pin S, via the test point 1a, negative voltage pulses relative to the logic ground Vss. Typically, these voltage pulses are brief, for example with a duration of the order of a microsecond with a serial impedance R1 of 50 ohms, which corresponds to normal properties of short pulse generators.

means 402.a2 for periodic measurement of the voltage at the terminals of the protection diode acting in the direct direction during the application of the negative pulses, in order to detect (DT) a temperature rise.

means 402.b (FIG. 1) for measuring the propagation time of the heat $\Delta P=t1-t0$, receiving as inputs a test activation command K, corresponding to the activation of the heating means 401, and the detection signal DT.

Measuring this time of heat propagation $\Delta P$ by the heat pipe, from the time t0 when it is "activated" on the heat exchanger by the means 401 and the time t1 when it is detected on the component by the means 402 makes it possible to qualify the heat path, and to determine whether it is correct or incorrect, typically by comparison with reference values.

These reference values are typically values determined by simulation or by learning on an item of hardware that is considered to be correct. Notably, in a learning phase, it may be useful to characterize the temperature build-up curve of the end 201 of each heat pipe 200 connected to the heat exchanger 300. Such a characterization curve will notably make it possible to determine the intensity of heating current IC to be applied to the resistor R2, making it possible to place the end 201 of the heat pipe at a sufficient operating temperature. For this purpose, it is therefore useful to provide on the heat exchanger either built-in temperature sensors or housings making it possible to accommodate them (not shown).

In practice, the application of a test of heat pipes of a computer therefore requires the provision:

On a test surface of the computer, for each component 101 of the computer that is connected to a heat pipe:

an input point representative of (that is to say connected to) the logic ground Vss of the component (or to the supply voltage); and an input point representative of a pin of the component, preferably an unused pin and preferably an output pin.

On the heat exchanger, at least one current loop having at least one resistor thermally coupled to the exchanger making it possible to stimulate the heating of the heat exchanger in the zone(s) to which the heat pipe(s) is/are connected.

The test method that has just been described therefore makes it possible, by using each heat pipe to be tested in the reverse direction, with a provision of heat at the heat exchanger outside the computer, to verify that the temperature rise is propagated rapidly at the critical component situated at the other end of this heat pipe.

This measurement of the heat propagation time between the heat exchanger and the component situated at the other end of the heat pipe makes it possible to determine its effectiveness.

The use of a resistor or resistors built into the heat exchanger, and, according to a preferred embodiment of the invention, the use of the protection diodes inherent in the electronic components, makes it possible to produce a device for testing the heat pipes that is simple, low-cost, effective and has good sensitivity.

Figure 4:
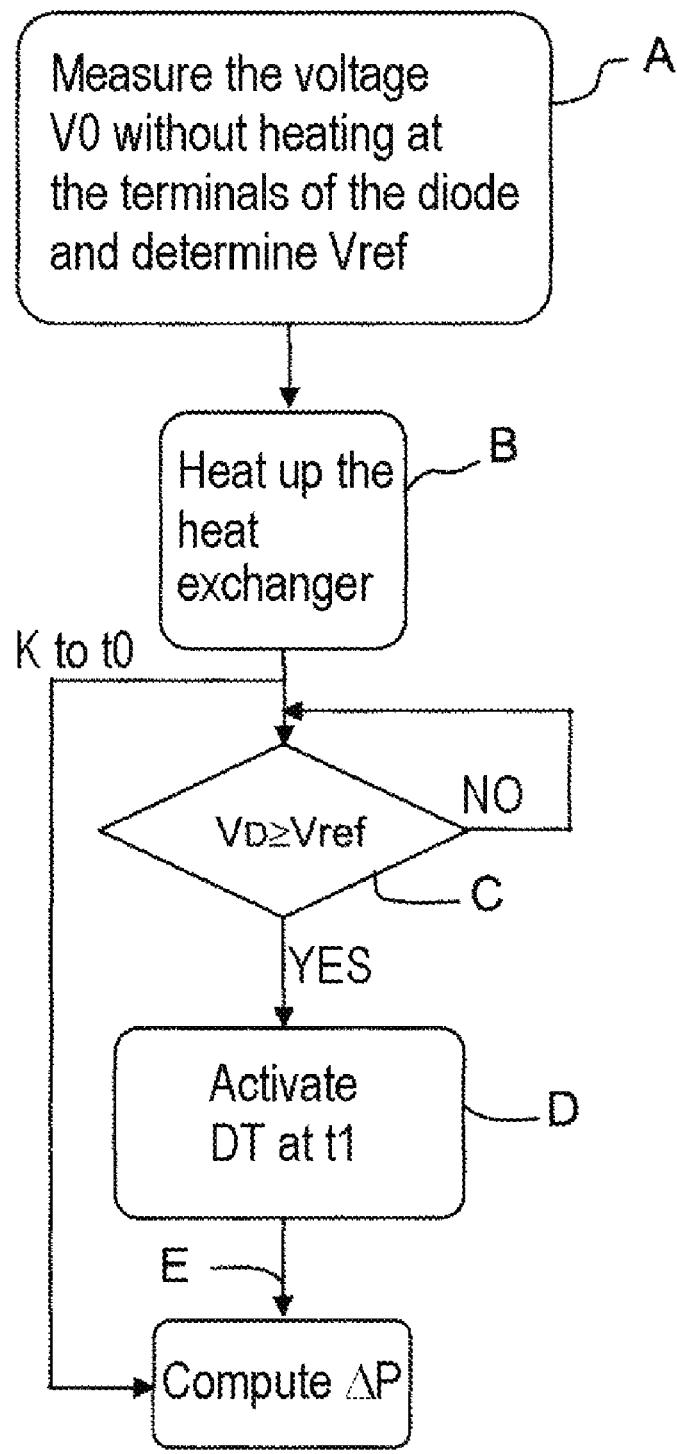
FIG. 4 is a flow chart illustrating a method for testing a heat pipe according to embodiments of the invention.

FIG. 4 summarizes the main steps of a method for testing the quality of the thermal contact between a heat pipe and an electronic component, using a diode D for protecting the electronic component in order to detect heat.

The steps of this method are as follows:

B: activation K of the test at a time t0, by providing heat on the heat exchanger 300, typically by injecting a current IC into the current loop 401.a.

C: loop for comparing the voltage $V_D$ at the terminals of the diode D with a reference voltage Vref.

D: if the voltage at the terminals of the diode D becomes equal to or greater than the reference voltage Vref, activation of a detection signal DT.

E: measurement of the propagation time ΔP, equal to the difference in time between the activation at the time t1, of the detection signal DT, and the activation of the test at time t0.

The propagation time ΔP obtained makes it possible to qualify the effectiveness of the tested heat pipe.

In practice, the reference voltage Vref used may be determined in a prior step A. The reference voltage Vref is determined to correspond to a significant change in temperature.

Typically, this may be done by the periodic measurement of the voltage at the terminals of the diode D, without the addition of heat, by measuring the voltage V0 at the terminals of the diode after application of negative pulses by the means 402.a1 (FIG. 2). The voltage Vref is then chosen to be greater than this voltage V0, to correspond to a significant change in temperature. Typically, for silicon technology components, Vref is taken to be a value 15 millivolts above the value of V0, making it possible to detect a temperature rise of approximately 20°.

Embodiments of the invention that has just been described makes it possible to test, in an effective and sensitive manner, the thermal contact between a heat pipe and an electronic component of a computer. The measurement uses commercially available circuits (pulse generators, current loops) and preferably protection diodes inherent in the electronic components in order to detect heat, rather than industrial temperature sensors, which also provides the following advantages:

an industrial temperature sensor can measure only the heat detected at the casing; the diode that is connected to the logic ground makes it possible to reach the substrate of the component: it is therefore possible to qualify the heat chain from the exchanger to the substrate of the component.

an industrial sensor is an additional component of which it is necessary to route the two ends to the test connector and of which the careful thermal coupling will also require a meticulous operation; the diode is inherent in the electronic component.

It will be readily seen by one of ordinary skill in the art that embodiments of the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by the definition contained in the appended claims and equivalent thereof.

The invention claimed is:

1. A method for testing a heat pipe between an electronic component and a heat exchanger, wherein the method comprises the steps of:
    bringing heat to the heat exchanger;
    inverting the direction of heat circulation in the heat pipe; and measuring the time required for the heat to propagate in the heat pipe up to the electronic component.

2. The method according to claim 1, wherein the electronic component is mounted on a board inside an electronic module, and the heat exchanger is placed on the outside of the electronic module.

3. The method according to claim 1, wherein a current loop supplies electrical current to a resistor incorporated into the heat exchanger.

4. The method according to claim 3, wherein the heat exchanger comprises a temperature sensor close to the resistor.

5. The method according to claim 3, wherein the heat exchanger comprises a housing for receiving a temperature sensor close to the resistor.

6. The method according to claim 1, wherein the step of measuring the time for the heat to propagate further comprises the step of:
    detecting a change of a voltage at the terminals of a diode for protection against electrostatic discharges at a pin of the electronic component.

7. The method according to claim 6, wherein the step of measuring the time for the heat to propagate further comprises the steps of:
    generating voltage pulses to control a current that passes directly into the diode; and
    comparing the voltage developed at the terminals of the diode to a reference voltage.

8. The method according to claim 6, wherein the pin is an output pin of the electronic component.

9. The method according to claim 6, wherein the protection includes an anode connected to the logic ground of the electronic component.

10. A device for testing a heat pipe operationally arranged in thermal contact between an electronic component and a heat exchanger, to carry heat dissipated by the electronic component to the heat exchanger, the heat pipe having a first end in thermal contact with the electronic component and having a second end in thermal contact with the heat exchanger, wherein the testing device comprises:
    a heating apparatus configured to heat the heat exchanger at least in a zone in which the heat exchanger is in thermal contact with the heat pipe; and
    a temperature measuring apparatus configured to detect a temperature rise of the electronic component.

11. The device according to claim 10, wherein the heating apparatus comprises a current loop and a resistor in series in the loop.

12. A device for testing a heat pipe in thermal contact between an electronic component and a heat exchanger, comprising:
    a heating apparatus adapted to bring heat at least into a zone of the heat exchanger in which the heat exchanger is in thermal contact with the heat pipe; and
    a temperature measuring apparatus adapted to measure a temperature rise of the electronic component;
    wherein the temperature measuring apparatus comprises:
        an application apparatus adapted to apply a voltage pulse to a protection diode associated with a pin of the electronic component, in order to control a current directly into the diode; and
        a voltage measuring apparatus adapted to measure the voltage at the terminals of the diode.

13. The device according to claim 12, comprising a comparing apparatus adapted to compare the measured voltage with a reference voltage characteristic of a temperature rise, in order to supply a detection signal.

14. The device according to claim 12, wherein the heating apparatus comprises a current loop and a resistor in series in the loop.

15. The device according to claim 14, wherein the resistor is incorporated into the heat exchanger.

16. The device according to claim 15, wherein the heat exchanger also comprises a temperature sensor, close to the resistor.

17. The device according to claim 15, wherein the heat exchanger also comprises a housing for receiving a temperature sensor, close to the resistor.

* * * * *